(12) United States Patent
Lee et al.

(10) Patent No.: US 10,638,614 B2
(45) Date of Patent: Apr. 28, 2020

(54) SEMICONDUCTOR PACKAGE MODULE

(71) Applicant: Samsung Electronics Co., Ltd., Suwon-si (KR)

(72) Inventors: Hyuk-jin Lee, Hwaseong-si (KR); Kyu-deuk Kim, Cheonan-si (KR); Jae-young Hong, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 16/112,759

(22) Filed: Aug. 26, 2018

(65) Prior Publication Data
US 2019/0246505 A1 Aug. 8, 2019

(30) Foreign Application Priority Data
Feb. 2, 2018 (KR) ........................ 10-2018-0013434

(51) Int. Cl.
*H05K 1/18* (2006.01)
*H05K 3/34* (2006.01)
(Continued)

(52) U.S. Cl.
CPC .......... *H05K 3/3405* (2013.01); *H05K 1/181* (2013.01); *H05K 3/3452* (2013.01); *H01R 12/707* (2013.01); *H01R 12/7041* (2013.01); *H01R 12/725* (2013.01); *H05K 3/0052* (2013.01); *H05K 3/3415* (2013.01); *H05K 2201/10015* (2013.01); *H05K 2201/10159* (2013.01);
(Continued)

(58) Field of Classification Search
CPC ....... H05K 3/3405; H05K 3/341–3452; H05K 1/181
See application file for complete search history.

(56) References Cited

U.S. PATENT DOCUMENTS 6,287,130 B1 9/2001 Torii
9,627,809 B2 4/2017 Gordon
(Continued)

FOREIGN PATENT DOCUMENTS

JP 3409530 B2 3/1997
JP 2000-251989 A 9/2000
(Continued)

*Primary Examiner* — Hoa C Nguyen
(74) *Attorney, Agent, or Firm* — Muir Patent Law, PLLC

(57) ABSTRACT

A semiconductor package module is provided. The semiconductor package module may prevent dropout of a large-scale device from a module substrate by improving bonding strength between the module substrate and a part, and perform assembling parts on a top surface and a bottom surface of the module substrate, simultaneously. The semiconductor package module includes: a module substrate; at least one first electric/electronic device mounted on the module substrate by using surface mount technology (SMT); a plurality of passive devices mounted on the module substrate; and at least one second electric/electronic device mounted on the module substrate by using SMT and a resin film adhesive, the at least one second electric/electronic device having a size or a weight greater than a size or a weight of the at least one first electric/electronic device.

16 Claims, 13 Drawing Sheets

(51) Int. Cl.
*H01R 12/72* (2011.01)
*H05K 3/00* (2006.01)
*H01R 12/70* (2011.01)

(52) U.S. Cl.
CPC .............. *H05K 2201/10189* (2013.01); *H05K 2201/10446* (2013.01); *H05K 2201/10545* (2013.01); *H05K 2201/10992* (2013.01); *H05K 2203/1484* (2013.01); *H05K 2203/163* (2013.01)

(56) References Cited

U.S. PATENT DOCUMENTS

| | | | |
|---|---|---|---|
| 2004/0169275 A1* | 9/2004 | Danvir | H01L 21/563 |
| | | | 257/737 |
| 2009/0317989 A1 | 12/2009 | Daily et al. | |
| 2011/0240352 A1* | 10/2011 | Nakamura | H05K 3/225 |
| | | | 174/258 |
| 2016/0276307 A1* | 9/2016 | Lin | H01L 21/561 |
| 2016/0315403 A1 | 10/2016 | Xiao et al. | |
| 2017/0062957 A1 | 3/2017 | Choi | |

FOREIGN PATENT DOCUMENTS

| | | |
|---|---|---|
| JP | 2013-062295 A | 4/2013 |
| KR | 10-1082448 | 11/2011 |
| KR | 10-2012-0064665 | 6/2012 |
| KR | 10-2016-0030988 | 3/2016 |

* cited by examiner

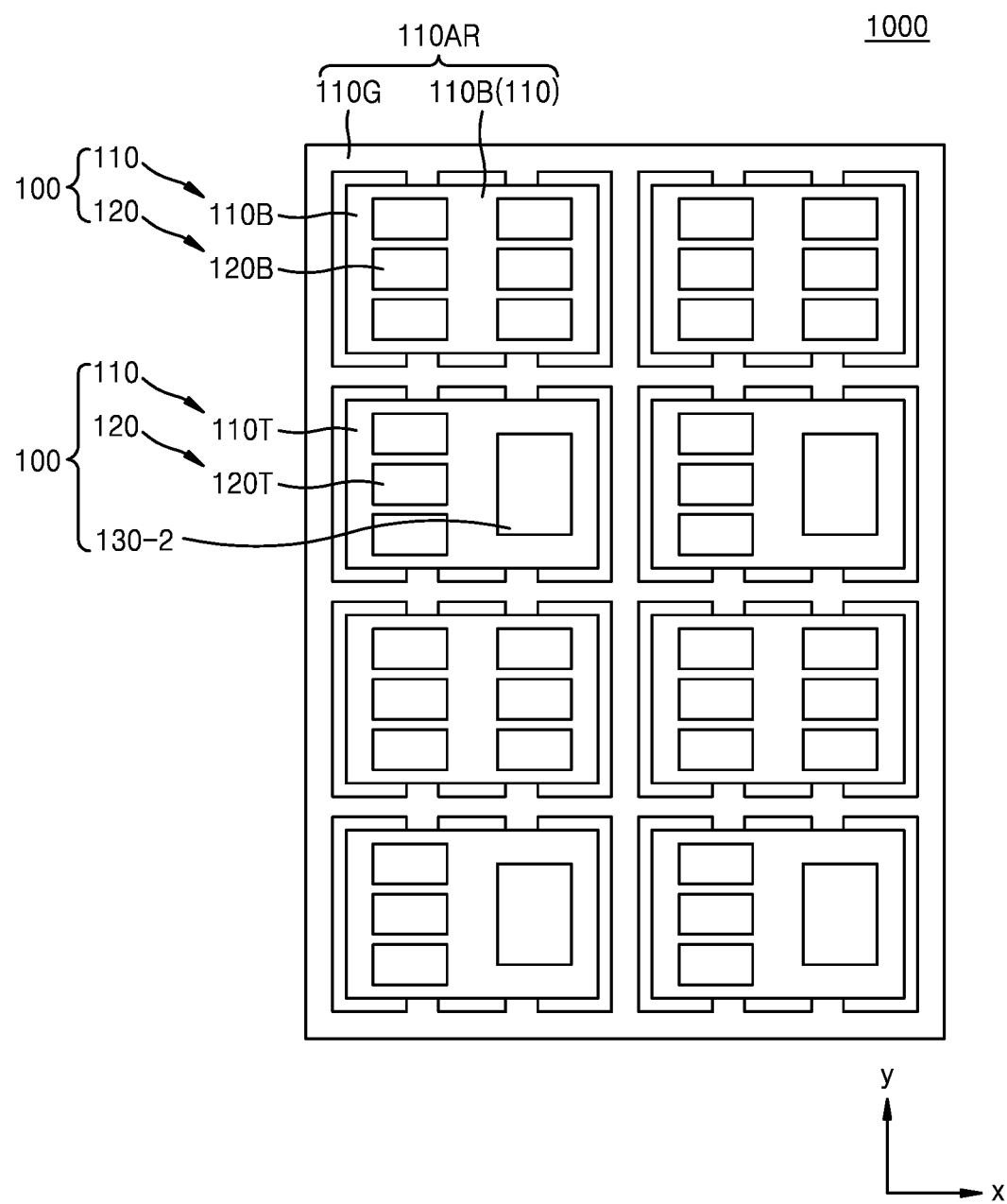

SEMICONDUCTOR PACKAGE MODULE

CROSS-REFERENCE TO RELATED APPLICATION

This application claims the benefit of Korean Patent Application No. 10-2018-0013434, filed on Feb. 2, 2018, in the Korean Intellectual Property Office, the disclosure of which is incorporated herein in its entirety by reference.

BACKGROUND

The inventive concept relates to a semiconductor package module, and more particularly, to a semiconductor package module on which parts are mounted thereon by using surface mount technology (SMT).

Generally, miniaturization of a semiconductor device part is for miniaturization of a semiconductor package module which is a generic aggregate. Here, the semiconductor package module denotes an electronic part in which one or more active devices and one or more passive devices are arranged on a single board substrate (or, a single module substrate), or a generic aggregate structure thereof, and is generally referred to as a module part. An active device may be generally configured as a semiconductor chip or a semiconductor package. The semiconductor chip or the semiconductor package may include the active device and the passive device. In addition, the passive device may be, for example, a resistor, an inductor, a capacitor, etc. Active devices and passive devices may be mounted on the board substrate by using SMT. However, a large or a heavy part mounted on the module substrate of the semiconductor package module may fall down from the module substrate during a process of SMT.

SUMMARY

The inventive concept provides a semiconductor package module which may prevent dropout of a large-scale device from a module substrate by improving bonding strength between the module substrate and a part, and may simultaneously assemble parts on a top surface and a bottom surface of the module substrate.

According to an aspect of the inventive concept, there is provided a semiconductor package module including: a module substrate; at least one first electric/electronic device mounted on the module substrate by using surface mount technology (SMT); a plurality of passive devices mounted on the module substrate; and at least one second electric/electronic device mounted on the module substrate by using SMT and a resin film adhesive, the at least one second electric/electronic device having a size or a weight greater than a size or a weight of the at least one first electric/electronic device.

According to another aspect of the inventive concept, there is provided a semiconductor package array structure including: a module substrate array including at least two module substrates coupled to each other; at least one first part mounted on each of the at least two module substrates by using surface mount technology (SMT); and at least one second part mounted on each of the at least two module substrates by using SMT and a resin film adhesive, the at least one second part having a size or a weight greater than a size or a weight of the at least one first part, wherein a top surface and a bottom surface of the at least two module substrates are arranged alternately in a first direction when viewed from a first surface of the module substrate array.

According to another aspect of the inventive concept, there is provided a semiconductor package module including: a board substrate; at least one first part mounted on the board substrate by using a solder paste; and at least one second part doubly bonded and mounted on the board substrate by using the solder paste and a resin film adhesive, the at least second part having a size or a weight greater than a size or a weight of the at least one first part.

BRIEF DESCRIPTION OF THE DRAWINGS

Embodiments of the inventive concept will be more clearly understood from the following detailed description taken in conjunction with the accompanying drawings in which:

FIG. 8 is a plan view of a semiconductor package array structure according to example embodiments.

DETAILED DESCRIPTION

Figure 1A:
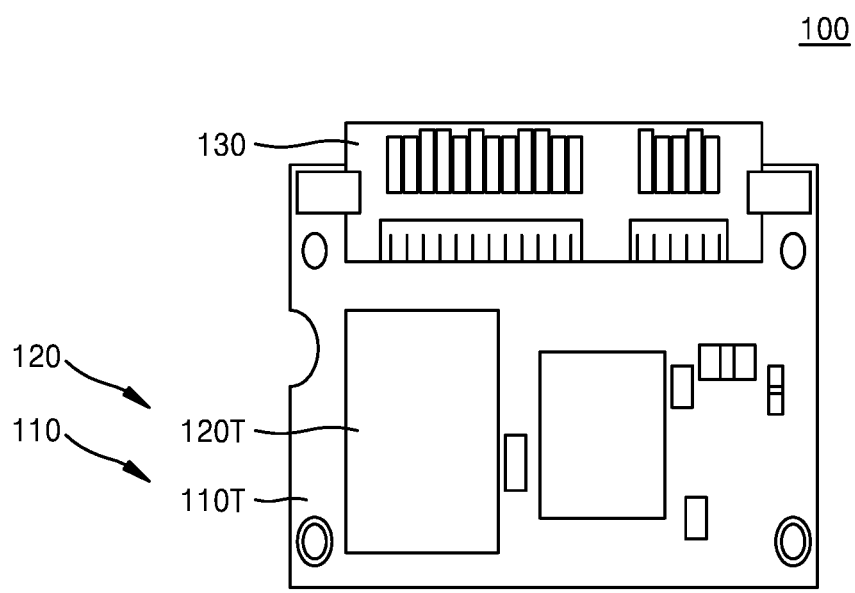
FIGS. 1A to 1C are respectively plan views and a side view of a semiconductor package module according to example embodiments.

Hereinafter, embodiments of inventive concept are described in detail with reference to the accompanying drawings. In the drawings, like reference numerals are used for like elements, and repeated descriptions thereof are omitted.

Figure 1B:
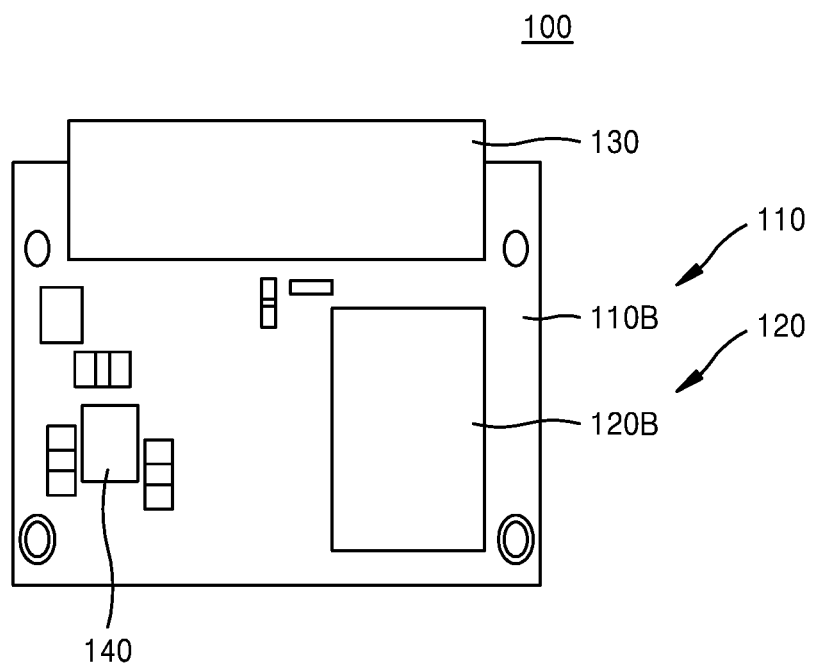
Figure 1C:
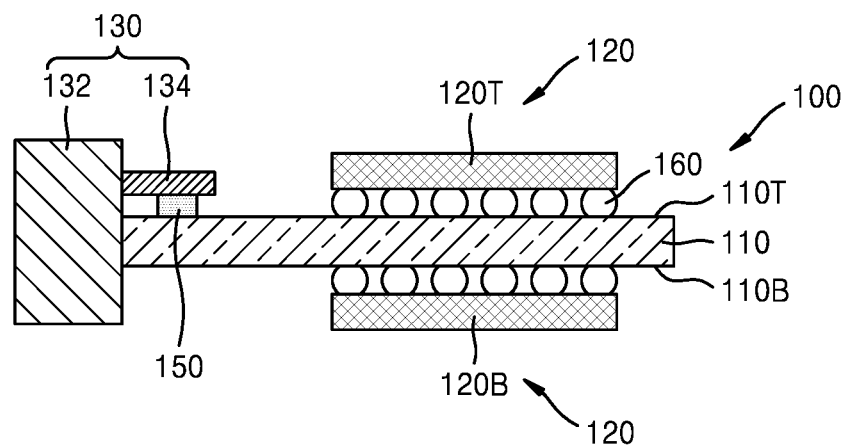

FIGS. 1A to 1C are respectively plan views and a side view of a semiconductor package module 100 according to example embodiments. FIG. 1A illustrates a top surface of the semiconductor package module 100, and FIG. 1B illustrates a bottom surface of the semiconductor package module 100.

Referring to FIGS. 1A to 1C, the semiconductor package module 100 may include a package substrate 110, a first electric/electronic device 120, a second electric/electronic device 130, and a passive device 140. The package substrate 110 may be referred to as a module substrate, a board substrate, a module board, or a module board substrate. The first electric/electronic device 120 may be one of a plurality of first electric/electronic devices 120, the second electric/electronic device 130 may be one of a plurality of second electric/electronic devices 130, and the passive device 140 may be one of a plurality of passive devices 140. The semiconductor package module 100 may be, for example, a solid state drive (SSD) module, a memory module, a computer system module, a mobile system module, etc. However, a kind of the semiconductor package module 100 is not limited thereto. In some examples, the semiconductor package module 100 may be a memory card.

Figure 2A:
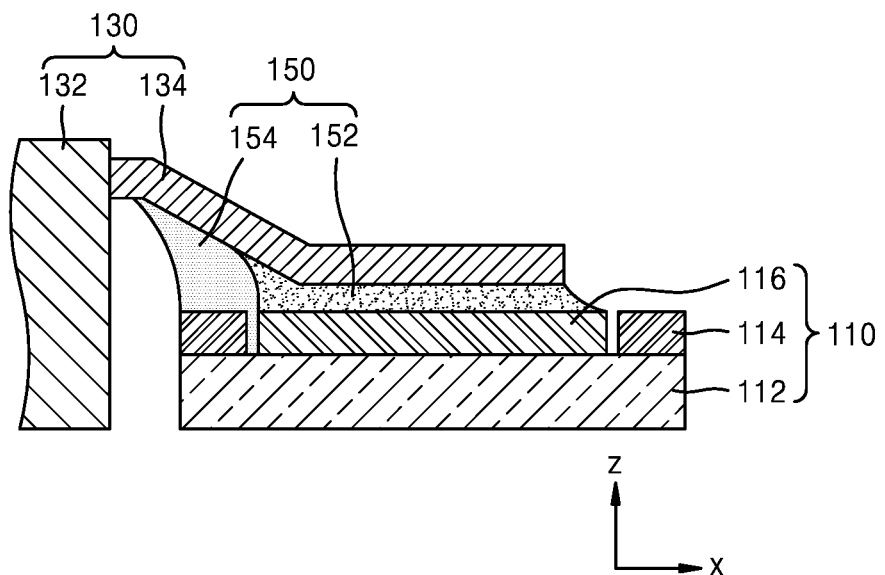
FIGS. 2A and 2B are enlarged cross-sectional views of a bonded portion of a second electric/electronic device and a package substrate in the semiconductor package module of FIG. 1A according to example embodiments.

The package substrate 110 may include a substrate body 112 (see FIG. 2A), a protective layer 114 (see FIG. 2A), and a substrate pad 116 (see FIG. 2A). The substrate body 112 may include a body layer in which a glass epoxy (or FR-4) resin, a phenol resin, or a BT resin, etc. are compressed to a preset thickness, and a circuit wiring formed on the body layer. The circuit wiring may be formed by patterning a Cu-foil coated on the body layer.

The protective layer 114 may include, for example, solder resist (SR) configured to cover the circuit wiring. The protective layer 114 may have a structure configured to cover the circuit wiring and expose the substrate pad 116.

The substrate pad 116 may be a portion of the circuit wiring or may be separately formed on the circuit wiring. In the case where the substrate pad 116 is separately formed on the circuit wiring, the substrate pad 116 may include, for example, at least one of Al, Cu, Ni, W, Pt, and Au. For reference, a conductive layer used for a fine bump or wire bonding is referred to as a pad, and a conductive layer used for a larger-sized solder ball, etc. is referred to as a land. Hereinafter, conductive layers at which connections to devices external to a substrate or board are made are collectively referred to as pads, for example, substrate pads.

A package substrate 110 may be classified into a package substrate for a single-layered printed circuit board (PCB) in which a circuit wiring is arranged on only one surface thereof, and a package substrate for a double-layered PCB in which circuit wirings are arranged on two opposite surfaces thereof. In the case of the package substrate 110 for a double-layered PCB, circuit wirings on a top portion and a bottom portion may be electrically connected through a via contact passing through a body layer. Also, the substrate body 112 may have a structure in which a Cu-foil is formed in three or more storeys by using an insulator referred to as prepreg and circuit wirings are formed in three or more storeys depending on the storeys of the Cu-foil. In the semiconductor package module 100 of the present embodiment, the package substrate 110 may be a package substrate for a double-layered PCB.

The first electric/electronic device 120 may be mounted onto two opposite surfaces of the package substrate 110 through solder balls 160. For example, the first electric/electronic device 120 may include a first top electric/electronic device 120T mounted on a top surface 110T of the package substrate 110, and a first bottom electric/electronic device 120B mounted on a bottom surface 110B of the package substrate 110. The first top electric/electronic device 120T and the first bottom electric/electronic device 120B may be devices having the same function and/or structure. Also, the first top electric/electronic device 120T and the first bottom electric/electronic device 120B may be devices having a different function and/or structure.

Referring to FIGS. 1A to 1C, one first electric/electronic device 120 may be mounted onto each of the top surface 110T and the bottom surface 110B of the package substrate 110. Also, the first electric/electronic devices 120 may be mounted at the same location on the top surface 110T and the bottom surface 110B of the package substrate 110. However, in the semiconductor package module 100 according to the present embodiment, the number and a mounting structure of first electric/electronic devices 120 are not limited thereto. For example, a plurality of first electric/electronic devices 120 may be mounted on the top surface 110T and the bottom surface 110B of the package substrate 110, and also, the first electric/electronic devices 120 may be respectively mounted at different locations on the top surface 110T and the bottom surface 110B of the package substrate 110.

The first electric/electronic device 120 may be a chip package including at least one semiconductor chip therein. For example, the first electric/electronic device 120 may include at least one memory chip or logic chip therein. For example, in the case where the first electric/electronic device 120 includes a memory chip, the first electric/electronic device 120 may be a memory device including dynamic random access memory (DRAM), synchronous random access memory (SRAM), a flash memory, electrically erasable programmable read-only memory (EEPROM), phase-change random access memory (PRAM), magnetoresistive random-access memory (MRAM), resistive random access memory (RRAM), etc. In the case where the first electric/electronic device 120 includes a logic chip, the first electric/electronic device 120 may be a logic device including a relatively small-sized logic chip. For example, the first electric/electronic device 120 may be a small-scale controller device. The first electric/electronic device 120 such as a semiconductor chip, a memory chip, or a logic chip may be formed from a wafer. The first electric/electronic device 120 may comprise a package which may include one or more chips stacked on a package substrate, or a package-on-package device including a plurality of packages.

The first electric/electronic device 120 may be mounted onto the package substrate 110 through surface mount technology (SMT). SMT may denote so-called automatic soldering technology which automatically mounts an electronic part on a surface of a PCB by using a solder paste. For example, SMT may denote technology which automatically mounts a semiconductor device, a diode, or a chip onto a PCB by using a solder paste with equipment, such as a chip mounter or a multi-mounter, and hardens the same. In SMT, heat and pressure may be applied such that a relevant part is easily bonded by using the solder paste. Reflow in which the solder paste is melted by the applied heat and pressure may occur. Therefore, SMT may include a reflow process. For reference, as a relative concept of SMT, there is insert mount technology (IMT). IMT is different from SMT in that a part is arranged on only one surface of a PCB in IMT, but parts are arranged on both two opposite surfaces of a PCB in SMT.

The second electric/electronic devices 130 may denote large-sized and/or heavy devices compared to the first electric/electronic devices 120. The second electric/electronic devices 130 may include, for example, a connector, a controller, and an electrolytic cap. Here, the electrolytic cap is a unipolar capacitor, has a large capacitance, and may be used for a low frequency filter or a bypass. A kind of the second electric/electronic devices 130 is not limited to the above-described devices. For example, an electric/electronic device which includes a large number of chips therein or includes a passive device, etc. and thus has a large size and/or heavy weight compared to a general electric/electronic device may be regarded as the second electric/electronic device 130. Also, chip packages such as a generally large-sized microprocessor, central processing unit (CPU), controller, and application specific integrated circuit (ASIC) may be regarded as the second electric/electronic device 130. Furthermore, the second electric/electronic device 130 may include a system on chip (SoC) type application processor (AP) used in a mobile system, for example, a mobile phone, an MP3 player, a navigation, a portable multimedia player (PMP), etc.

In the semiconductor package module 100 according to the present embodiment, the second electric/electronic device 130 may be a connector. Also, as illustrated in FIG. 1C, the second electric/electronic device 130 may be mounted onto the package substrate 110 through a structure in which a main body 132 of the second electric/electronic device 130 is arranged on a lateral surface of the package substrate 110, and a lead 134 of the second electric/electronic device 130 is electrically connected to the top surface 110T of the package substrate 110 by using a composite adhesive 150. In the semiconductor package module 100 according to the present embodiment, the second electric/electronic device 130 may be doubly bonded and mounted onto the package substrate 110 by using SMT and a resin film adhesive 154 (see FIG. 2A). Therefore, since the second electric/electronic device 130 is solidly bonded and maintained on the package substrate 110, the reliability of the semiconductor package module 100 may improve. The mounting of the second electric/electronic device 130 onto the package substrate 110 by using the composite adhesive 150 is described below in more detail with reference to FIGS. 2A, 2B, and 3A to 3D.

The passive devices 140 may denote all of electronic devices configured not to perform an active function such as amplification or conversion of electric energy. The passive device 140 may include a main body and an electrode terminal. The main body may be, for example, a resistor, an inductor, a capacitor, etc. A kind of the passive device 140 may be determined depending on a kind of the main body. For example, in the case where the main body is a resistor, the relevant passive device 140 may be a resistor device, and in the case where the main body is a capacitor, the relevant passive device 140 may be a capacitor device. Generally, the passive device 140 is a two-terminal device, and thus electrode terminals may be respectively arranged on two opposite surfaces of the main body.

The passive device 140 may be also mounted onto the package substrate 110 by using a solder paste. That is, the passive device 140 may be mounted onto the package substrate 110 by using SMT. The passive device 140 may be mounted onto a single surface or two opposite surfaces of the package substrate 110. Meanwhile, though the passive device 140 may be mounted onto the substrate pad 116 of the package substrate 110 by using a solder paste, the passive device 140 may be mounted onto the package substrate 110 through a separate bump or fine solder ball arranged between the electrode terminal of the passive device 140 and the substrate pad 116.

For reference, in the semiconductor package module 100 according to the present embodiment, discrimination between the first electric/electronic device 120 and the passive device 140 may be discrimination according to a function and a structure. For example, the first electric/electronic device 120 may be an active device including a memory chip or a logic chip and may have a package structure. In contrast, the passive device 140 is not an active device and may not have a package structure. However, depending on an embodiment, the passive device 140 may also have a package structure.

If the passive device 140 is classified into one of the first electric/electronic device 120 and the second electric/electronic device 130, the passive device 140 may be classified into the first electric/electronic device 120. Specifically, a size and/or a weight of the passive device 140 may be similar to or less than a size and/or a weight of the first electric/electronic device 120. Also, the passive device 140 may be mounted onto the package substrate 110 through SMT which uses only a solder paste. Therefore, the passive device 140 may be classified into the first electric/electronic device 120. However, depending on an embodiment, in the case where the passive device 140 is formed in a large size or a heavy weight, the passive device 140 may be classified into the second electric/electronic device 130 and bonding by a resin film adhesive may be additionally performed.

In the semiconductor package module 100 according to the present embodiment, the large-sized second electric/electronic device 130 may be doubly bonded and mounted onto the package substrate 110 by using SMT and the resin film adhesive. Therefore, since the second electric/electronic device 130 is solidly bonded and maintained on the package substrate 110, a defect such as dropout that the second electric/electronic device 130 is detached from the package substrate 110 may be prevented.

Also, in the semiconductor package module 100 according to the present embodiment, since the large-sized second electric/electronic device 130 is solidly bonded onto the package substrate 110 by using SMT and the resin film adhesive, an assembling process of a part onto the package substrate 110 may be performed through a bottom top array (BTA) technology, and therefore, a mounting process may be simplified, productivity may be improved, and replacement and/or operation loss of equipment may be reduced. The BTA technology is described below in more detail with reference to FIGS. 5A and 5B.

Furthermore, in the semiconductor package module 100 according to the present embodiment, due to solid bonding strength of the second electric/electronic device 130 onto the package substrate 110, an additional fill process such as under-fill or side-fill is not required for the second electric/electronic device 130. Therefore, a process may be simplified, and also, the reliability of a whole electronic device or an electronic system including the semiconductor package module 100 may improve under a user use environment.

Figure 2B:
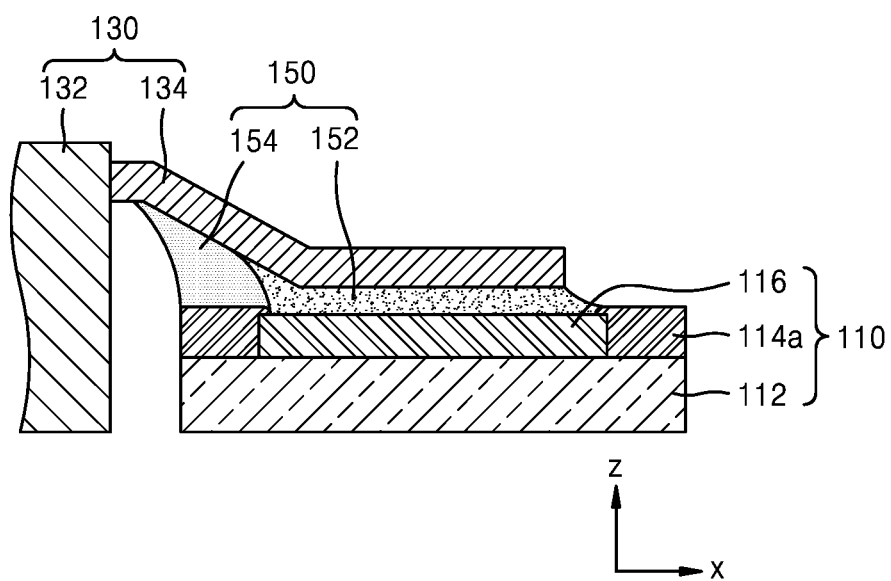

FIGS. 2A and 2B are enlarged cross-sectional views of a bonded portion of a second electric/electronic device 130 and a package substrate in the semiconductor package module of FIG. 1A according to example embodiments. Descriptions already provided above with reference to FIGS. 1A to 1C are briefly provided or omitted.

Referring to FIGS. 2A and 2B, the second electric/electronic device 130 may include the main body 132 and the lead 134. In the semiconductor package module 100 according to the present embodiment, the second electric/electronic device 130 may be, for example, a connector. The lead 134 may have a structure which protrudes from a lateral surface of the main body 132. Also, the lead 134 may not maintain the same height in a third direction (z-direction) with respect to a first direction (x-direction), and a portion away from the lateral surface of the main body 132 in the first direction (x-direction) may have a lower height. For example, the lead 134 may include a first portion connected to the main body 132, a second portion spaced apart from the main body 132 and having a height lower than that of the first portion, and a third portion which connects the first portion to the second portion and gradually lowers. However, the shape of the lead 134 is not limited thereto. For example, the entirety of the lead 134 may have the same height in the third direction (z-direction) with respect to the first direction (x-direction).

The package substrate 110 may include the substrate body 112, the protective layer 114, and the substrate pad 116. Since the substrate body 112, the protective layer 114, and the substrate pad 116 have been already described with reference to FIGS. 1A to 1C, detailed descriptions thereof are omitted. Meanwhile, as illustrated in FIG. 2A, a structure in which a lateral surface of the substrate pad 116 is not covered by the protective layer 114 and is spaced a little from the protective layer 114 is referred to as a non-solder-mask defined (NSMD) pad structure. In contrast, as illustrated in FIG. 2B, a structure in which a protective layer 114a covers the lateral surface and a portion of a top surface of the substrate pad 116 is referred to as a solder-mask defined (SMD) pad structure.

As illustrated in FIGS. 2A and 2B, the lead 134 of the second electric/electronic device 130 may be bonded and electrically connected onto the substrate pad 116 of the package substrate 110 through the composite adhesive 150. More specifically, the composite adhesive 150 may include a solder paste 152 and the resin film adhesive 154. The solder paste 152 may be mainly arranged between the lead 134 and the substrate pad 116 to electrically connect the lead 134 to the substrate pad 116. The resin film adhesive 154 may be arranged on a lateral surface of the solder paste 152 and between the lead 134, and the protective layer 114 to more solidly bond the lead 134 onto the package substrate 110. Meanwhile, FIGS. 2A and 2B illustrates that the resin film adhesive 154 is arranged on only a top surface of the protective layer 114. However, it is not limited thereto and the resin film adhesive 154 may be arranged on a portion of a top surface of the substrate pad 116 and the solder paste 152.

As described above, in the case where the second electric/electronic device 130 is bonded and mounted onto the substrate pad 116 of the package substrate 110 by using only the solder paste 152, it may be stated that the second electric/electronic device 130 is mounted through SMT. In contrast, in the semiconductor package module 100 according to the present embodiment, the solder paste 152 and the resin film adhesive 154 may be used for mounting the second electric/electronic device 130 onto the package substrate 110. Therefore, in the semiconductor package module 100 according to the present embodiment, mounting the second electric/electronic device 130 onto the package substrate 110 is referred to as mounting by using SMT and the resin film adhesive 154.

The resin film adhesive 154 may include, for example, an epoxy film adhesive having a thermosetting characteristic. However, a material of the resin film adhesive 154 is not limited to epoxy. For example, the resin film adhesive 154 may include another resin material having a similar characteristic to that of epoxy, that is, a characteristic having adhesiveness and thermosetting property. In some examples, since the resin film adhesive 154 has a thermosetting property, once hardened, the resin film adhesive 154 may not be re-melted by heat or pressure.

The resin film adhesive 154 may have a film shape, for example, a flat sheet shape having flat top and bottom surfaces. Therefore, the resin film adhesive 154 may be easily and conveniently utilized as an adhesive configured to mount a part onto the package substrate 110 by cutting the resin film adhesive 154 in an appropriate size and shape and arranging the same onto a required portion. In some examples, a final structure of the resin film adhesive 154 after the resin film adhesive 154 is used for bonding may not maintain a film shape. This is because heat and pressure applied while the resin film adhesive 154 is used for bonding cause melting and change the shape of the resin film adhesive 154.

Specifically, during SMT, a process is performed while heat and pressure are applied, and thus, reflow of the solder paste 152 occurs. During the reflow of the solder paste 152, fluidity of the resin film adhesive 154 due to melting may also occur. Therefore, as illustrated in FIGS. 2A and 2B, the solder paste 152 and the resin film adhesive 154 may have arbitrary shapes between the second electric/electronic device 130 and the substrate pad 116.

FIGS. 3A to 3D are cross-sectional views of a process of bonding a second electric/electronic device onto a package substrate according to example embodiments. Already described contents in the descriptions of FIGS. 1A to 1C, 2A, and 2B are briefly described or omitted.

Figure 3A:
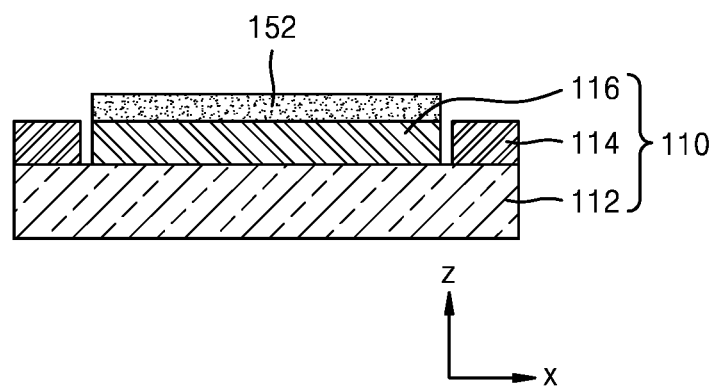
FIGS. 3A to 3D are cross-sectional views of a process of bonding a second electric/electronic device onto a package substrate according to example embodiments.

Referring to FIG. 3A, first, the solder paste 152 is provided on the substrate pad 116 of the package substrate 110. The solder paste 152 may be provided in a uniform thickness on the substrate pad 116 by using, for example, a printer. The printer is, for example, a screen printer, and the solder paste 152 may be provided onto the substrate pad 116 by using the printer through a stencil method. However, coating of the solder paste 152 through a dispense method or a pin transfer method instead of the stencil method may be performed. The solder paste may include, for example, a flux and powder, etc.

After the solder paste 152 is provided, whether the solder paste 152 is properly provided onto the substrate pad 116 is inspected through auto optical inspection (AOI). For example, a formed location, a thickness, a total volume, etc. of the solder paste 152 may be inspected through the AOI. The AOI in this operation is referred to as a printing AOI (P-AOI).

Figure 3B:
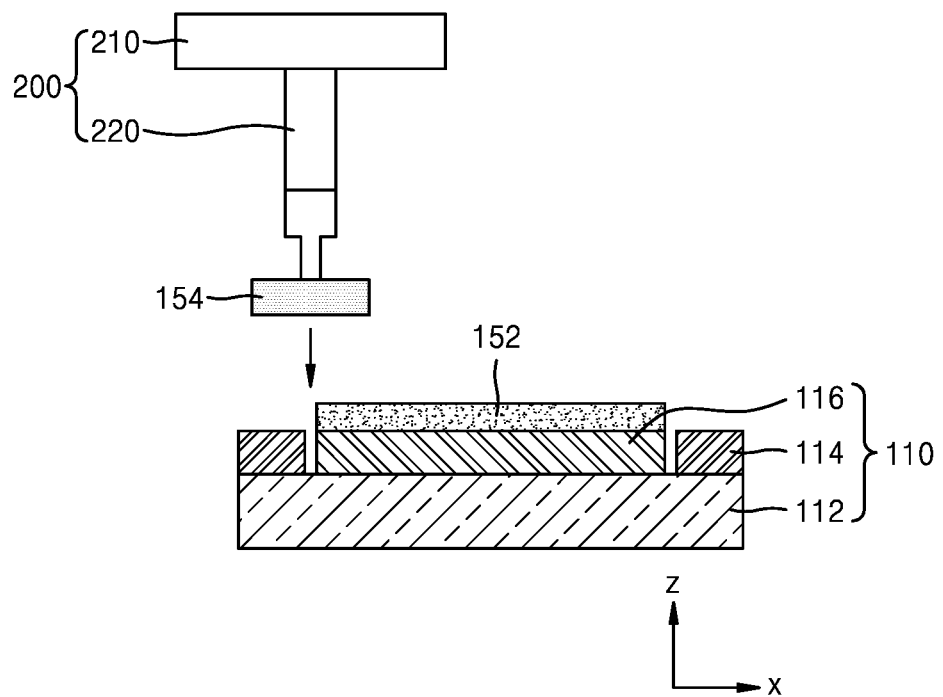
Figure 3C:
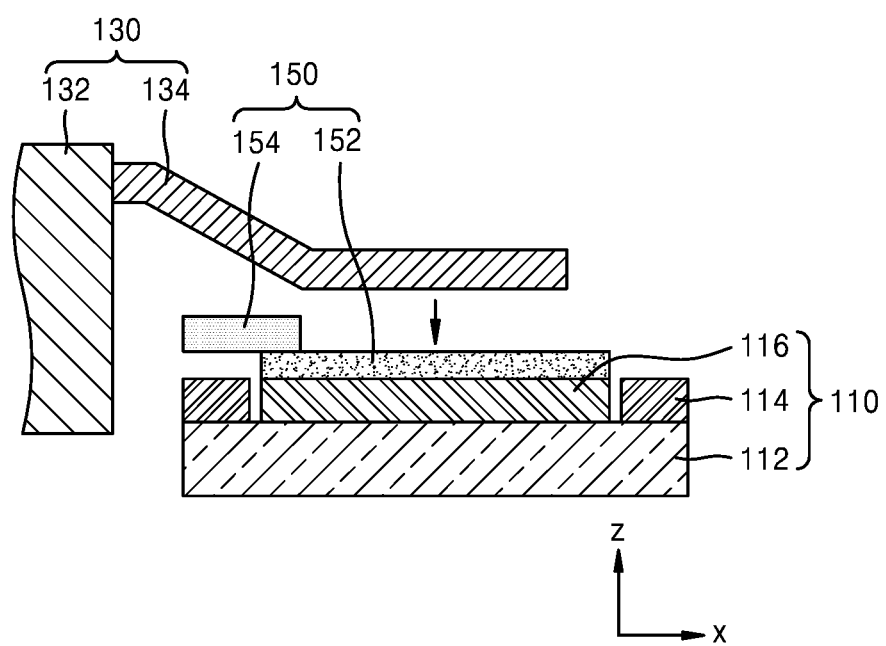

Referring to FIG. 3B, after the solder paste 152 is provided, the resin film adhesive 154 is arranged on an outer portion of the solder paste 152 by using a multi-mounter. For convenience of description, the multi-mounter is illustrated by only a body 210 and a protruded adsorber 220 of a pick-and-place unit 200. For example, the resin film adhesive 154 is vacuum-adsorbed by the pick-and-place unit 200 and placed on an arrangement-required portion. A shape in which the resin film adhesive 154 is arranged by the pick-and-place unit 200 is illustrated in FIG. 3C. For reference, as described with reference to FIG. 3C, the multi-mounter is equipment configured to mount a chip package or the second electric/electronic device 130, which is a large-scale part, onto the package substrate 110, and may be equipment already generally used for SMT. Therefore, additional equipment is not required for arranging the resin film adhesive 154.

Meanwhile, referring to FIG. 3C, though the resin film adhesive 154 is arranged on the solder paste 152 with some interval from the protective layer 114, the interval may be actually very fine by considering that a thickness of the solder paste 152 is about 100 μm, which is very thin. An arrangement shape of the resin film adhesive 154 onto the solder paste 152 is described in more detail with reference to FIGS. 4A to 4C.

Meanwhile, during a substantial mounting process of mounting parts onto the package substrate 110, before the resin film adhesive 154 is arranged on the outer portion of the solder paste 152, small-sized passive devices 140 may be mounted onto the package substrate 110 through a chip mounter.

Referring to FIG. 3C, after the resin film adhesive 154 is mounted, the second electric/electronic device 130, which is a large-scale device, is mounted through the multi-mounter. Specifically, the second electric/electronic device 130 may be arranged onto the package substrate 110 through the pick-and-place unit 200 of the multi-mounter such that the lead 134 of the second electric/electronic device 130 is located on a portion of the package substrate 110 on which the solder paste 152 and the resin film adhesive 154 are arranged.

After the second electric/electronic device 130 is mounted by using the multi-mounter, whether the second electric/electronic device 130 has been accurately mounted on a required location of the package substrate 110 is inspected by the AOI. For example, whether the lead 134 of the second electric/electronic device 130 has been arranged on an accurate location of the relevant substrate pad 116 of the package substrate 110 at an accurate posture, etc. are inspected through the AOI. The AOI in this operation is referred to as mounting AOI (M-AOI).

Meanwhile, the first electric/electronic device 120 such as a chip package may be mounted onto the package substrate 110 through the multi-mounter. However, in the case of the first electric/electronic device 120, only the solder paste may be provided and the resin film adhesive may not be provided on a bonding portion.

Figure 3D:
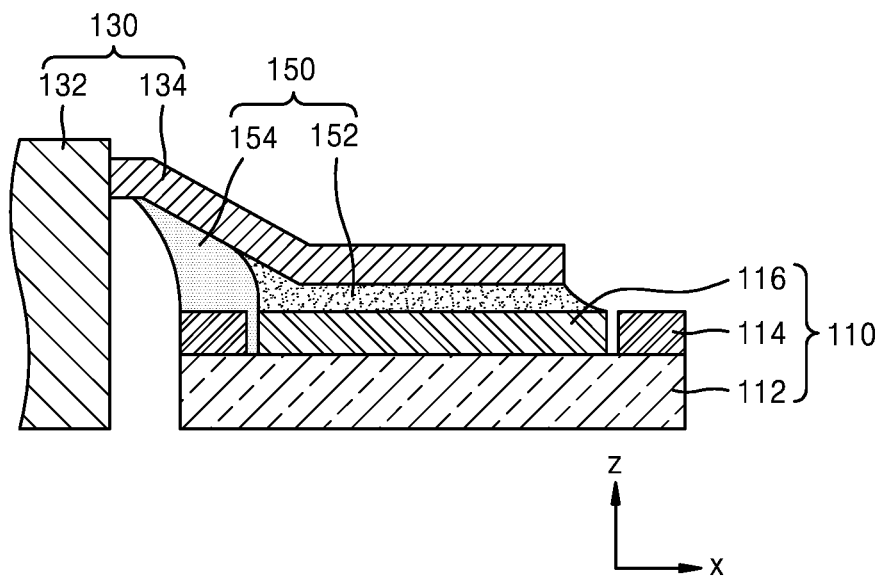

Referring to FIG. 3D, after the second electric/electronic device 130 is mounted, a reflow process is performed by using reflow equipment. The reflow process may denote a process of closely attaching the lead 134 of the second electric/electronic device 130 onto the composite adhesive 150, that is, the solder paste 152 and the resin film adhesive 154 while applying heat and pressure. Depending on an embodiment, only heat may be applied during the reflow process. Through the reflow process, the solder paste 152 and the resin film adhesive 154 are melted, a portion of the lead 134 of the second electric/electronic device 130 may be coupled onto the substrate pad 116 through the solder paste 152, and a portion of the lead 134 of the second electric/electronic device 130 may be coupled onto the protective layer 114 through the resin film adhesive 154. Meanwhile, since the solder paste 152 and the resin film adhesive 154 are hardened through a cooling process afterward, the lead 134 of the second electric/electronic device 130 may be solidly bonded and coupled onto the package substrate 110. In some examples, in FIG. 3D, although the resin film adhesive 154 is arranged on only the protective layer 114, the resin film adhesive 154 may be arranged on a portion of a top surface of the substrate pad 116 and the solder paste 152, as described with reference to FIGS. 2A and 3C.

After that, whether the second electric/electronic device 130 is properly coupled onto the package substrate 110 is inspected by the AOI. For example, whether soldering has been properly performed based on a shape of the composite adhesive 150, and whether the lead 134 of the second electric/electronic device 130 has been properly attached without detachment from the relevant substrate pad 116 of the package substrate 110, etc. are inspected by using the AOI. The AOI in this operation is referred to as soldering-AOI (S-AOI).

Figure 4A:
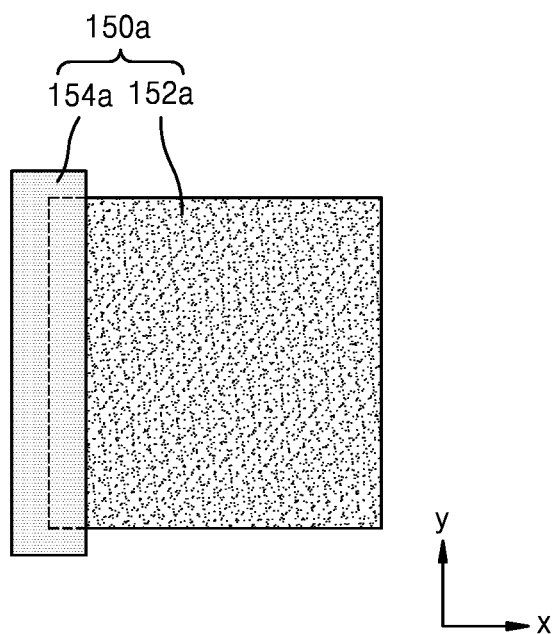
FIGS. 4A to 4C are plan views of a structure of each of a solder paste and a resin film adhesive of a composite adhesive, and a relative arrangement configuration thereof, according to example embodiments.
Figure 4B:
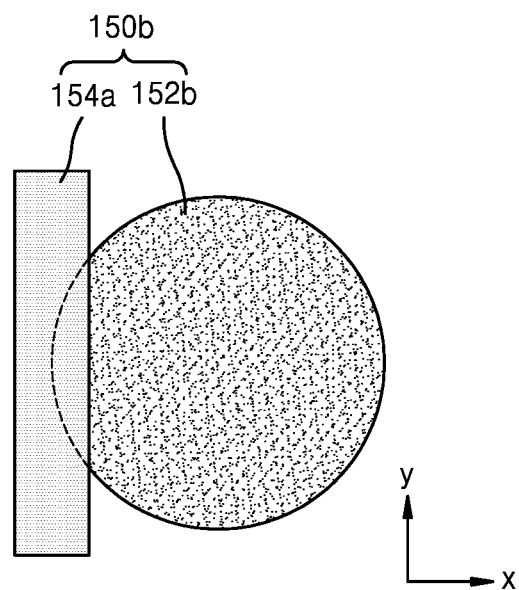
Figure 4C:
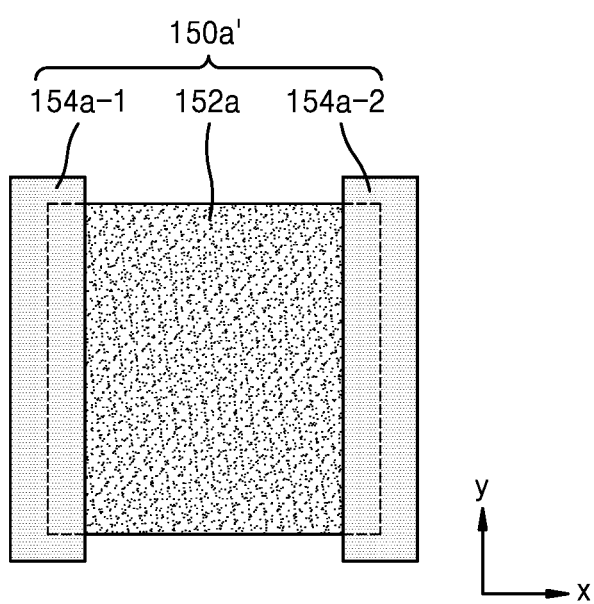

FIGS. 4A to 4C are plan views of a structure of each of a solder paste 152a and a resin film adhesive 154a of a composite adhesive 150a, and a relative arrangement configuration thereof, according to example embodiments.

Referring to FIG. 4A, in the semiconductor package module 100 according to the present embodiment, the composite adhesive 150a may include the rectangular solder paste 152a and the resin film adhesive 154a having an elongated shape in one direction. Also, the resin film adhesive 154a may cover one of outer edges of the solder paste 152a. For example, the resin film adhesive 154a may cover a left edge of the solder paste 152a. However, it is not limited thereto, and the resin film adhesive 154a may cover another edge of the solder paste 152a.

In example embodiments, a length of the resin film adhesive 154a may be longer than an edge of the solder paste 152a covered by the resin film adhesive 154a. For example, a length of the resin film adhesive 154a in a second direction (y-direction) may be longer than a length of a left edge of the solder paste 152a in the second direction (y-direction). However, depending on an embodiment, the length of the resin film adhesive 154a may be substantially the same as or less than the length of a corresponding edge of the solder paste 152a.

In the semiconductor package module 100 according to the present embodiment, although the solder paste 152a of the composite adhesive 150a has a rectangular shape, the shape of the solder paste 152a is not limited thereto. For example, the solder paste 152a may have various polygonal shapes such as a triangle, a pentagon, and a hexagon. Also, the resin film adhesive 154a may cover at least one outer edge of the polygon-shaped solder paste 152a.

For reference, when the composite adhesive 150a illustrated in FIG. 4A is cut along the first direction (x-direction) or viewed in the second direction (y-direction) from a lateral side, a shape like the composite adhesive 150 of FIG. 3C may be illustrated. In addition, FIG. 4A illustrates a configuration in which the composite adhesive 150a is arranged on the package substrate 110 before the second electric/electronic device 130 is bonded onto the package substrate 110, particularly, before a reflow process. A shape of the composite adhesive 150a after the second electric/electronic device 130 is bonded onto the package substrate 110 may be an arbitrary shape without maintaining a specific shape due to fluidity by melting. The concept for the shape of the composite adhesive 150a is equally applicable to composite adhesives 150b and 150c of FIGS. 4B and 4C.

Referring to FIG. 4B, in the semiconductor package module 100 according to the present embodiment, the composite adhesive 150b may include a circular solder paste 152b and the resin film adhesive 154a having an elongated shape in one direction. The resin film adhesive 154a may cover a portion of an outer edge of the solder paste 152b. In some examples, the solder paste 152b is not limited to a circular shape and may have an elliptical shape. Also, when the composite adhesive 150b illustrated in FIG. 4B is cut along the first direction (x-direction) or viewed in the second direction (y-direction) from a lateral side, a shape like the composite adhesive 150 of FIG. 3C may be illustrated.

In some examples, the resin film adhesive 154a is not limited to an elongated shape in one direction and may have a curved elongated shape corresponding to an edge of the circular solder paste 152b. As described above, since the resin film adhesive 154a has a curved elongated shape, the resin film adhesive 154a may match the edge of the circular solder paste 152b in an aspect of a shape and contribute to bonding strength improvement.

Referring to FIG. 4C, in the semiconductor package module 100 according to the present embodiment, a composite adhesive 150a' may include the rectangular solder paste 152a and two resin film adhesives 154a-1 and 154a-2 each having an elongated shape in one direction. The two resin film adhesives 154a-1 and 154a-2 may cover two outer opposite edges of the solder paste 152a. In this case, the two resin film adhesives 154*a*-1 and 154*a*-2 may also be arranged on two opposite edges of the substrate pad 116 disposed below the solder paste 152*a*.

In the semiconductor package module 100 according to the present embodiment, although the composite adhesive 150*a*' includes the two resin film adhesives 154*a*-1 and 154*a*-2, the number of resin film adhesives is not limited thereto. For example, the composite adhesive 150*a*' may include four resin film adhesives corresponding to the number of edges of the solder paste 152*a*. Also, in the case where the solder paste 152*a* has a different polygonal shape, a proper number of resin film adhesives may be included in the composite adhesive depending on the number of edges.

Meanwhile, in the case where the resin film adhesives 154*a*-1 and 154*a*-2 are arranged on two opposite edges of the solder paste 152*a* and bonding by using reflow is performed, bonding strength may increase even more. However, an amount of use of the resin film adhesive and a process time may increase. Therefore, a proper number of resin film adhesives may be selected by taking into account aspects of bonding strength improvement and productivity.

Figure 5A:
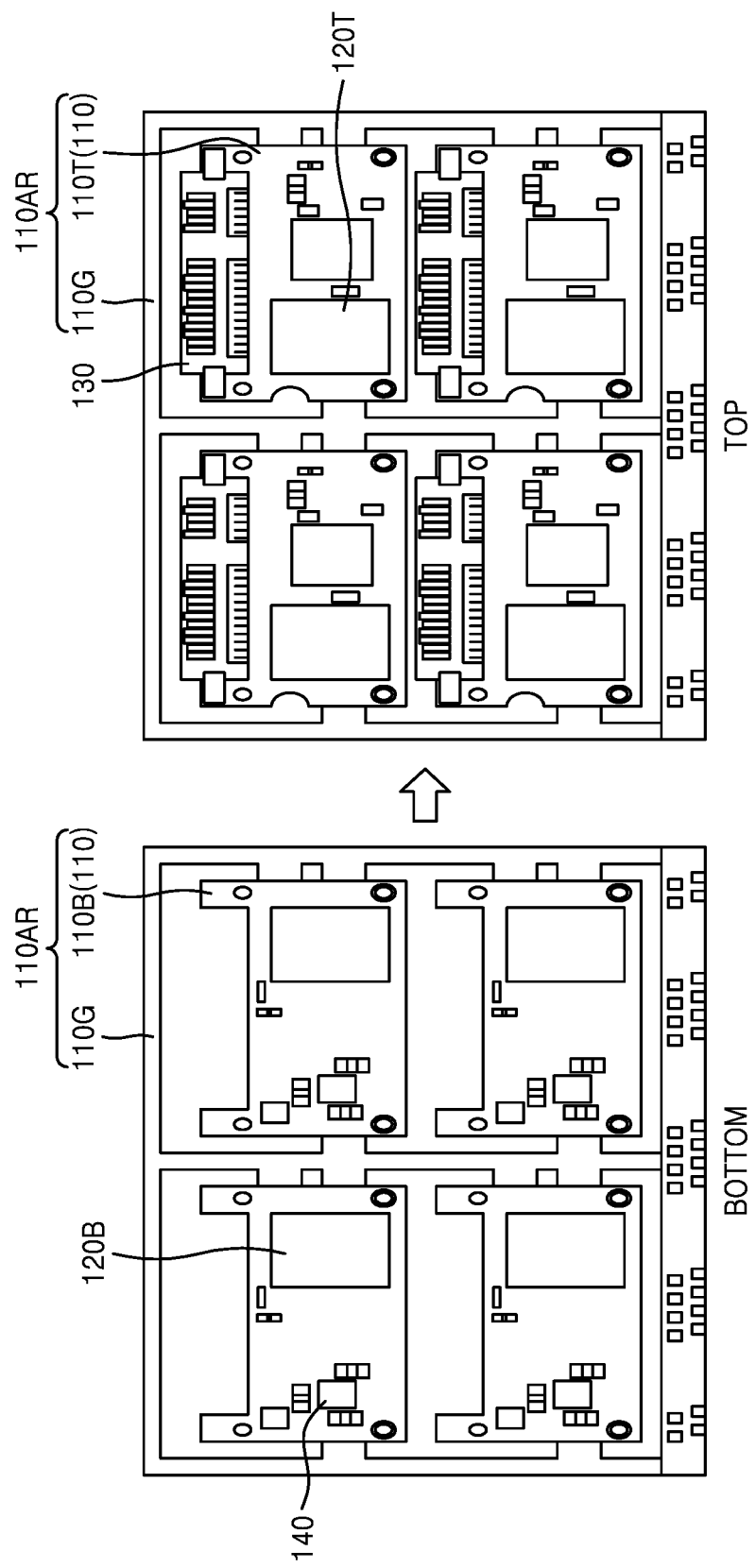
FIG. 5A is a plan view of a process of assembling parts onto a package substrate array.
Figure 5B:
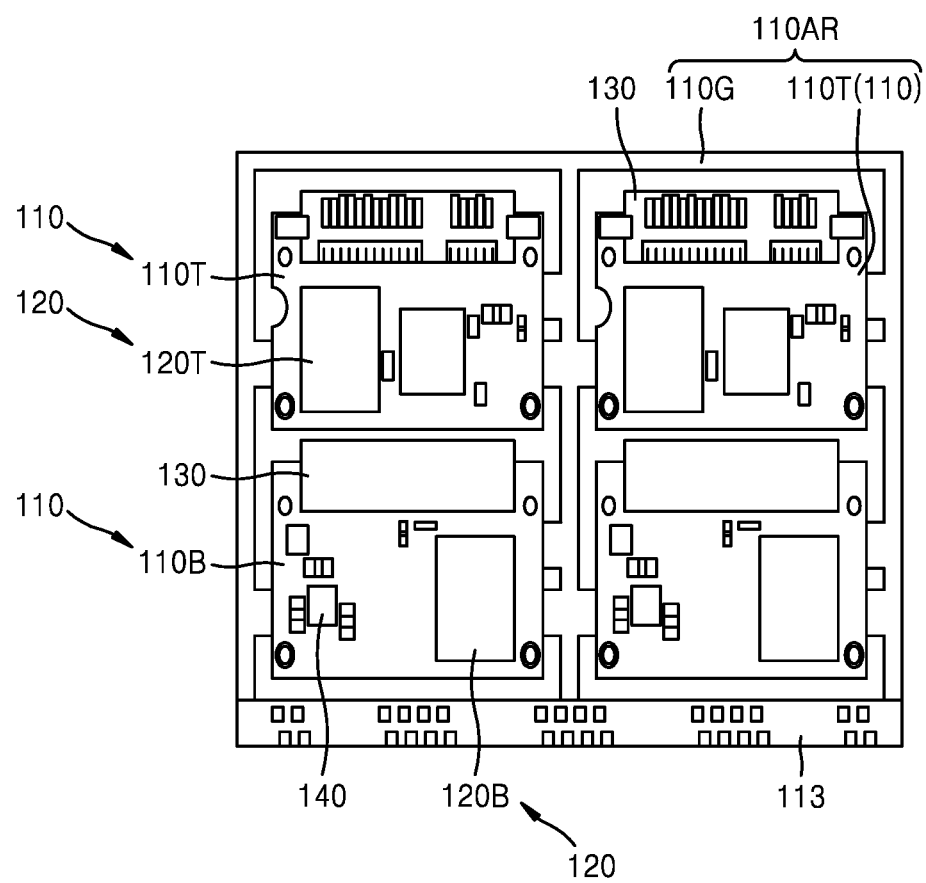
FIG. 5B is a plan view of a process of assembling parts onto a package substrate array according to example embodiments.

FIG. 5A is a plan view of a process of assembling parts onto a package substrate array 110AR, and FIG. 5B is a plan view of a process of assembling parts onto a package substrate array 110AR according to example embodiments. FIG. 5A illustrates a process of assembling parts by using only SMT without using the resin film adhesive, and FIG. 5B illustrates a process of assembling parts by using both SMT and the resin film adhesive.

Referring to FIG. 5A, the package substrate array 110AR may include a plurality of package substrates 110 and a substrate supporter 110G configured to support the package substrates. The package substrate array 110AR may be referred to as a module substrate array. Generally, when manufacturing an electronic device such as a semiconductor package module, each semiconductor package module is completed by simultaneously assembling parts onto the plurality of package substrates 110 of the package substrate array 110AR through SMT, etc., and finally separating the package substrates 110 from each other. Also, the assembling of parts onto the package substrate 110 may be performed on two opposite surfaces of the package substrate 110 as described above. Here, as described with reference to FIGS. 3A to 3D, SMT may include a printing process, a mounting process, and a reflow process.

Meanwhile, as illustrated in FIG. 5A, assuming that the second electric/electronic device 130 such as a connector is mounted onto the top surface 110T of the package substrate 110, in the case where parts are mounted onto the package substrate 110 through only SMT without using resin film adhesive, after an assembling process of parts onto the bottom surface 110B of the package substrates 110 is performed, the package substrate array 110AR is turned over and an assembling process of parts onto the top surface 110T of the package substrates 110 is performed. Also, the second electric/electronic device 130 may be mounted onto the package substrates 110 during only the assembling process of parts onto the top surface 110T of the package substrates 110.

Because SMT includes a reflow process, if parts are simultaneously assembled onto the top surface and the bottom surface of the package substrates 110, the package substrate array 110AR is turned over, and parts are assembled again onto the top surface and the bottom surface of the package substrates 110, a dropout defect that the heavy second electric/electronic device 130 falls down from the package substrate 110 during a second reflow process, may occur. Here, technology of simultaneously assembling parts onto the top surface and the bottom surface of the package substrates 110 is referred to as the BTA technology. Therefore, to assemble parts by using the BTA technology through only SMT without using resin film adhesive, parts are mounted onto one of the surfaces of the package substrate array 110AR by using the BTA technology through SMT, an additional separate fill process is performed, the package substrate array 110AR is turned over, and then parts are mounted onto the other surface of the package substrate array 110AR by using the BTA technology through SMT. Meanwhile, to secure reliability of the semiconductor package module 100 even though the BTA technology is not applied, after parts are mounted onto each surface of the package substrate array 110AR through SMT, a fill process may be additionally performed.

Referring to FIG. 5B, in the case where the second electric/electronic device 130 is mounted onto the package substrate 110 through SMT and the resin film adhesive, due to improvement of bonding strength of the second electric/electronic device 130, parts including the second electric/electronic device 130 may be simultaneously assembled onto the top surface 110T and the bottom surface 110B of the package substrates 110. For example, regardless of a mounting location of the second electric/electronic device 130 on the package substrate 110, the BTA technology may be applied to the package substrate array 110AR, and also a separate fill process is not required.

Specifically, as illustrated in FIG. 5B, parts including the second electric/electronic device 130 are simultaneously assembled onto the top surface 110T and the bottom surface 110B of the package substrates 110 on one surface of the package substrate array 110AR by using the BTA technology. In other words, the top surface 110T and the bottom surface 110B of the package substrates 110 simultaneously appear on one of the surfaces of the package substrate array 110AR, and parts including the second electric/electronic device 130 may be simultaneously assembled onto the top surface 110T and the bottom surface 110B of the package substrates 110. After that, the package substrate array 110AR is turned over, and parts including the second electric/electronic device 130 are simultaneously assembled onto the top surface 110T and the bottom surface 110B of the package substrates 110 on the other surface of the package substrate array 110AR.

As described above, in the case where the BTA technology is applied to the package substrate array 110AR, productivity may improve, a replacement loss of equipment may be reduced, and an operation loss related to a program, a tool of equipment, etc. may be reduced. For example, when a kind and a location of parts mounted on one of the surfaces of the package substrate array 110AR are different from a kind and a location of parts mounted on the other surface of the package substrate array 110AR, a program or a tool, etc. used for a mounting process is very complicated, an actual mounting process is complicated, and much processing time may be consumed. In contrast, when a kind and a location of parts mounted onto one of the surfaces of the package substrate array 110AR are substantially the same as a kind and a location of parts mounted onto the other surface of the package substrate array 110AR, a program or tool, etc. are simplified, and also an actual mounting process is simplified, and thus a processing time may be remarkably reduced. As a simple example, assuming that when a kind and a location of parts mounted on two opposite surfaces of the package substrate array 110AR are different from each other, one arrangement program is required for each surface, two arrangement programs are required. In contrast, when a kind and a location of parts mounted on the two opposite surfaces of the package substrate array 110AR are the same, only one arrangement program may be sufficient.

In the semiconductor package module 100 according to the present embodiment, since the second electric/electronic device 130, which is a large-scale device, is bonded onto the package substrate 110 through SMT and the resin film adhesive 154 with high bonding strength, the BTA technology may be applied to the package substrate array 110AR even without an additional separate fill process. Therefore, the semiconductor package module 100 according to the present embodiment may contribute to simplifying a mounting process, and improving productivity by reducing a replacement loss and an operation loss of equipment.

The package substrate array 110AR may be connected to a test connector 113 used to test semiconductor package modules on the package substrate array 110AR. The test connector 113 may be removed when the test is completed. And then the semiconductor package modules may be separated from each other by a cutting process.

In example embodiments, a method for manufacturing an individual semiconductor package module will be described below.

The solder paste 152 on the substrate pad 116 of the package substrate (e.g. module substrate) 110 may be provided in a first step, the resin film adhesive 154 having a flat sheet shape may be placed on an outer portion of the solder paste 152 in a second step, in one surface of the package substrate array 110AR (e.g., a module substrate array), a plurality of devices may be mounted on the module substrate 110, the solder paste 152, and the resin film adhesive 154 in a third step, heat and pressure may be applied to perform a first reflow process in a fourth step, in the other surface of the module substrate array 110AR, a plurality of devices may be mounted on the module substrate 110, the solder paste 152, and the resin film adhesive 154 in a fifth step, heat and pressure may be applied to perform a second reflow process in a sixth step, and a cutting process may be performed to separate each semiconductor package module from the module substrate array 110AR in a seventh step.

Figure 6A:
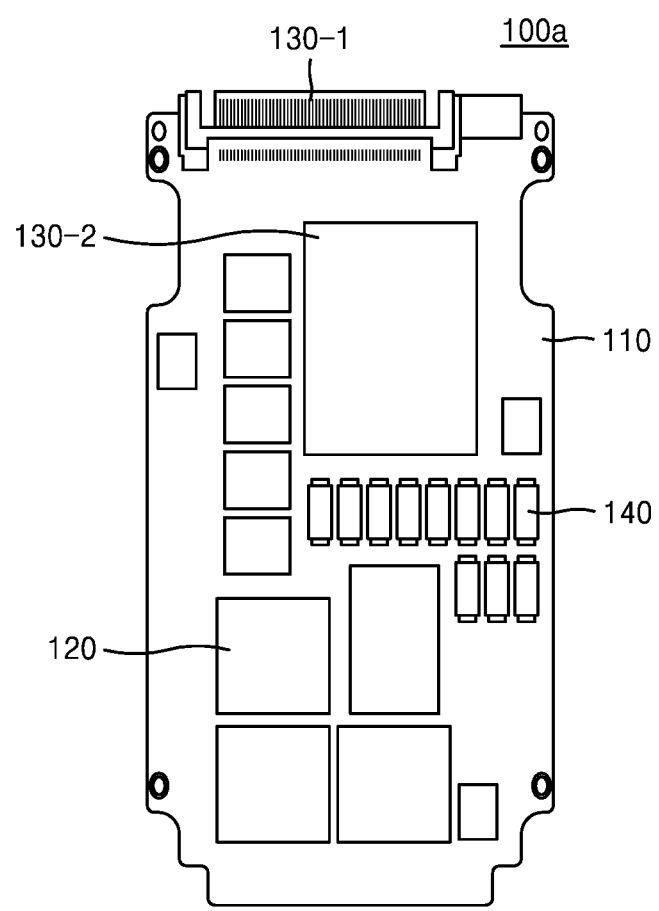
FIGS. 6A and 6B are plan views of a semiconductor package module according to example embodiments.
Figure 6B:
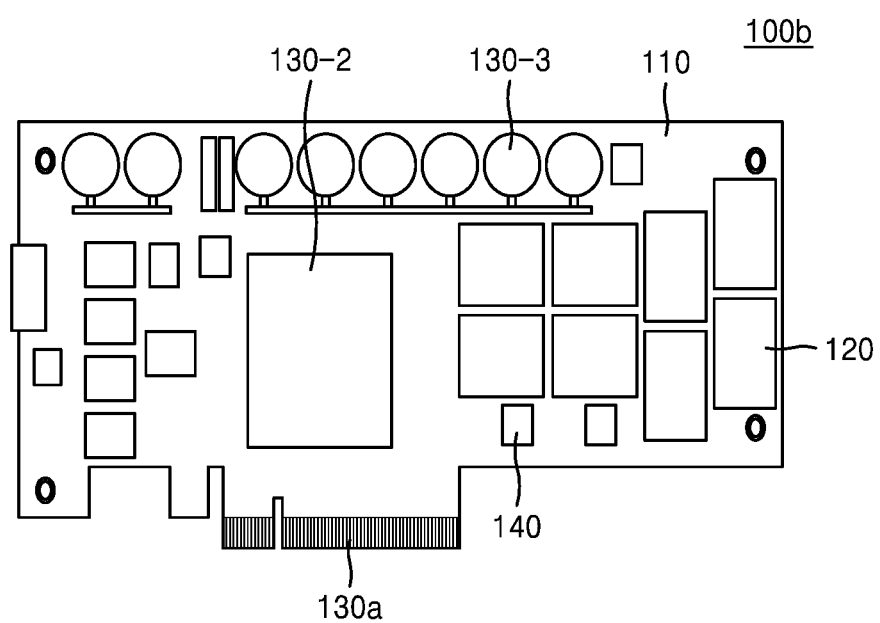

FIGS. 6A and 6B are plan views of a semiconductor package module 100a according to example embodiments. Already described contents in the descriptions of FIGS. 1A to 1C, 2A, 2B, 3A to 3D, 4A to 4C, 5A and 5B are briefly described or omitted.

Referring to FIG. 6A, the semiconductor package module 100a according to the present embodiment may include two second electric/electronic devices 130-1 and 130-2 which are large-scale devices. For example, the second electric/electronic device 130-1 arranged on an outer upper portion of the package substrate 110 may be a connector. Also, the second electric/electronic device 130-2 arranged inside the package substrate 110 may be a controller. In the semiconductor package module 100a according to the present embodiment, a kind of the two second electric/electronic devices 130-1 and 130-2 are not limited to the above-described devices. For example, like the semiconductor package module 100 of FIG. 1A, the plurality of first electric/electronic devices 120 and the plurality of passive devices 140 may be mounted onto the package substrate 110.

In the semiconductor package module 100a according to the present embodiment, the two second electric/electronic devices 130-1 and 130-2, which are large-scale devices, may be mounted onto the package substrate 110 by using SMT and the resin film adhesive 154 (see FIG. 2A). Therefore, the two second electric/electronic devices 130-1 and 130-2 may be solidly bonded and fixed on the package substrate 110 with high bonding strength. Also, based on the high bonding strength of the second electric/electronic devices 130-1 and 130-2, the semiconductor package module 100a may be manufactured by using the BTA technology, and thus productivity may improve, a replacement and/or operation loss of equipment may be reduced.

In example embodiments, the two second electric/electronic devices 130-1 and 130-2, one or more devices of the plurality of first electric/electronic devices 120, and one or more passive devices of the passive devices 140 may be mounted on one surface of the package substrate 110 of the semiconductor package module 100a. One or more devices of the plurality of first electric/electronic devices 120 and one or more passive devices of the passive devices 140 may be mounted on the other surface of the package substrate 110 of the semiconductor package module 100a.

Referring to FIG. 6B, the semiconductor package module 100b according to the present embodiment may include second electric/electronic devices 130-2 and 130-3 which are large-scale devices. For example, a plurality of second electric/electronic devices 130-3 arranged on an outer upper portion of the package substrate 110 may be electrolytic caps. Also, the second electric/electronic device 130-2 arranged inside the package substrate 110 may be a controller. In the semiconductor package module 100b according to the present embodiment, a kind of the second electric/electronic devices 130-2 and 130-3 is not limited thereto. For example, like the semiconductor package module 100 of FIG. 1A, the plurality of first electric/electronic devices 120 and the passive devices 140 may be mounted onto the package substrate 110. For example, in the semiconductor package module 100b according to the present embodiment, a connector 130a may be directly provided in the package substrate 110 without being mounted on the package substrate 110.

In the semiconductor package module 100b according to the present embodiment, since the second electric/electronic devices 130-2 and 130-3, which are large-scale devices, are mounted onto the package substrate 110 by using SMT and the resin film adhesive 154 (see FIG. 2A), they may be solidly bonded and fixed onto the package substrate 110 with high bonding strength. Also, based on the high bonding strength of the second electric/electronic devices 130-2 and 130-3, since the semiconductor package module 100b according to the present embodiment may be manufactured by using the BTA technology, it may contribute to productivity improvement and reduction of a replacement and/or operation loss of equipment.

In example embodiments, the second electric/electronic devices 130-2 and 130-3, one or more devices of the plurality of first electric/electronic devices 120, and one or more passive devices of the passive devices 140 may be mounted on one surface of the package substrate 110 of the semiconductor package module 100b. One or more devices of the plurality of first electric/electronic devices 120 and one or more passive devices of the passive devices 140 may be mounted on the other surface of the package substrate 110 of the semiconductor package module 100b.

Figure 7A:
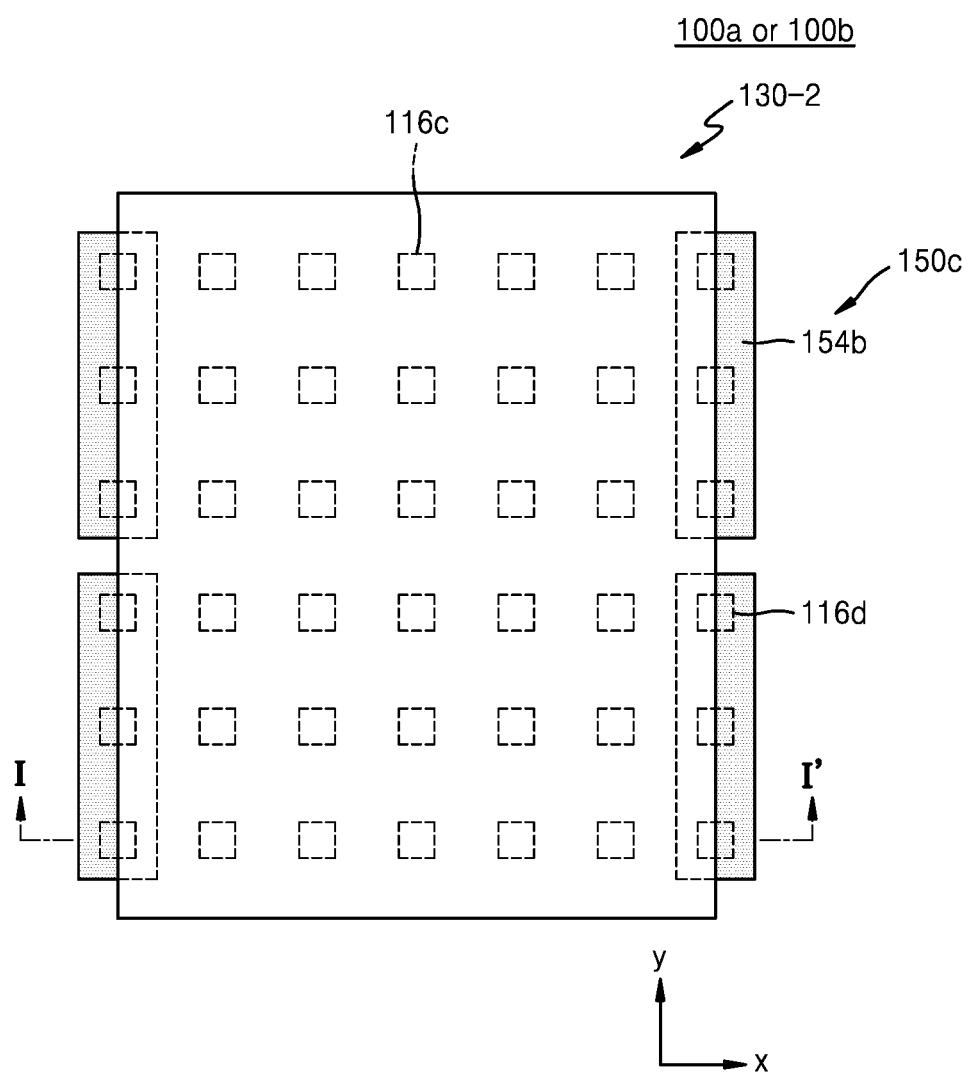
FIGS. 7A and 7B are a plan view and a cross-sectional view of a second electric/electronic device, which is a controller, mounted on a package substrate in the semiconductor package module of FIG. 6A or 6B, according to example embodiments.
Figure 7B:
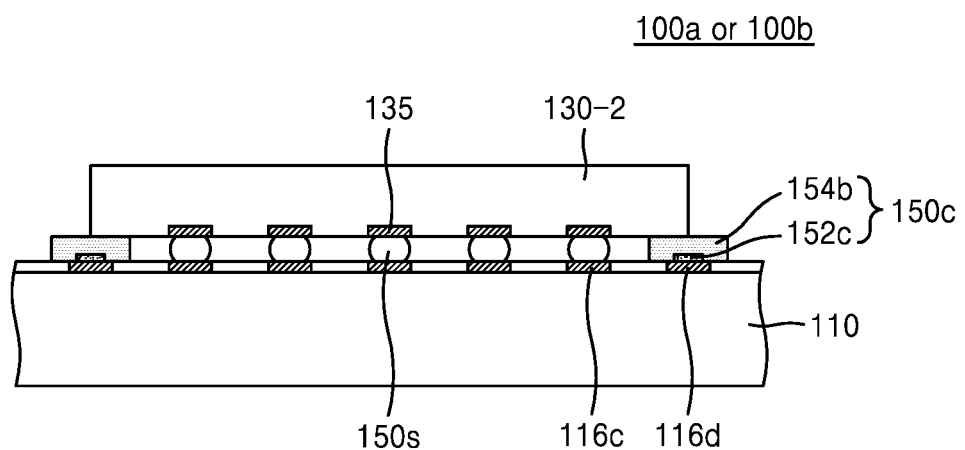
Figure 7C:
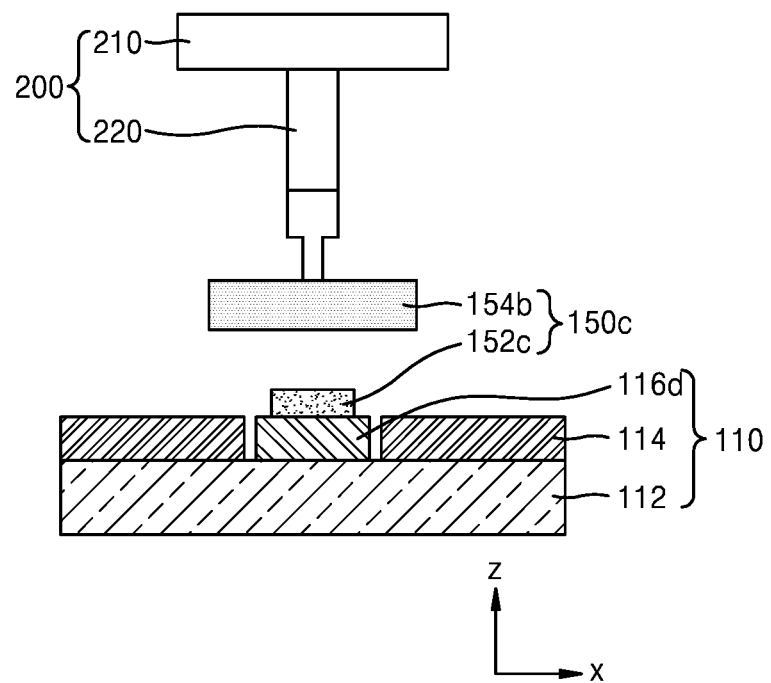
FIG. 7C is a cross-sectional view of a process of forming a resin film adhesive during a process of mounting the second electric/electronic device onto a package substrate according to example embodiments.

FIGS. 7A and 7B are a plan view and a cross-sectional view of a second electric/electronic device, which is a controller, mounted on a package substrate in the semiconductor package module of FIG. 6A or 6B, according to example embodiments, and FIG. 7C is a cross-sectional view of a process of forming a resin film adhesive during a process of mounting the second electric/electronic device onto a package substrate according to example embodiments.

FIG. 7A is a plan view of the second electric/electronic device 130-2, which is a controller, mounted on the package substrate 110 in the semiconductor package module of FIG. 6A or 6B, FIG. 7B is a cross-sectional view of the second electric/electronic device 130-2 taken along line I-I' of FIG. 7A, and FIG. 7C is a cross-sectional view of a process of forming a resin film adhesive during a process of mounting the second electric/electronic device 130-2 of FIG. 7B onto the package substrate 110. In FIG. 7A, a package substrate arranged under the second electric/electronic device is omitted.

Referring to FIGS. 7A to 7C, the semiconductor package module 100a or 100b according to the present embodiment may include the second electric/electronic device 130-2 mounted onto the package substrate 110. The second electric/electronic device 130-2 may be, for example, a controller. The second electric/electronic device 130-2 may be mounted onto the package substrate 110 through a solder bump 150s and a composite adhesive 150c.

More specifically, a device pad 135 may be arranged in only an inner region of a bottom surface of the second electric/electronic device 130-2. Also, a substrate pad 116c corresponding to the device pad 135 may be arranged on the package substrate 110. Therefore, the second electric/electronic device 130-2 may be mounted onto the package substrate 110 through the solder bump 150s between the device pad 135 and the substrate pad 116c, and may be electrically connected to circuit wirings of the package substrate 110. Here, the solder bump 150s may be substantially the same as a solder paste in aspects of a function and a material with only a little difference in shape. Generally, when a solder connects between fine-sized pads, the solder may be referred to as a solder bump or a bump. When a solder is coated on a relatively large area to connect large terminals such as a lead to a substrate pad, the solder may be referred to as a solder paste. Meanwhile, the mounting of the second electric/electronic device 130-2 onto the package substrate 110 by using the solder bump 150s may correspond to as mounting using SMT.

In some examples, the semiconductor package module 100a or 100b according to the present embodiment may further use the composite adhesive 150c to mount the second electric/electronic device 130-2 thereon. Also, a dummy pad 116d may be provided on the package substrate 110. Specifically, a plurality of dummy pads 116d may be provided on a portion of the package substrate 110 in the second direction (y-direction), the portion corresponding to an edge of the second electric/electronic device 130-2 extending in the second direction (y-direction). The dummy pad 116d is not related to electric connection with the second electric/electronic device 130-2, and may be provided on the package substrate 110 to serve as a medium of reinforcing bonding force of the solder paste 152c arranged thereon. The dummy pad 116d may be simultaneously formed when the substrate pad 116c is formed, and may include the same material as that of the substrate pad 116c. However, the substrate pad 116c is electrically connected to a circuit wiring of the package substrate 110, but the dummy pad 116d is not connected to a circuit wiring of the package substrate 110.

The composite adhesive 150c may include the solder paste 152c and a resin film adhesive 154b. As illustrated in FIG. 7C, the solder paste 152c may be coated on the dummy pad 116d before the second electric/electronic device 130-2 is mounted. The solder paste 152c may have a size less than that of the dummy pad 116d. However, it is not limited thereto and the solder paste 152c may be substantially the same as or greater than the dummy pad 116d.

The resin film adhesive 154b may have an elongated shape in the second direction (y-direction). Also, as illustrated in FIGS. 7A and 7B, the resin film adhesive 154b may have a size which may completely cover several dummy pads 116d and the solder paste 152c corresponding thereto. The resin film adhesive 154b may be arranged over the package substrate 110 to cover the dummy pad 116d and the solder paste 152c by using the pick-and-place unit 200 of the multi-mounter.

Referring to FIG. 7A, though two resin film adhesives 154b are arranged onto each of two opposite edges of the second electric/electronic device 130-2, the number and an arrangement structure of resin film adhesives 154b are not limited thereto. For example, the resin film adhesive 154b may be arranged, one by one, onto each of two opposite edges of the second electric/electronic device 130-2. Also, the resin film adhesive 154b may be arranged onto only one edge of the second electric/electronic device 130-2, or may be arranged onto all of four edges of the second electric/electronic device 130-2. Furthermore, the resin film adhesive 154b may have a shape such as a long polygon or a long ellipse, instead of a long rectangular band shape, and may be arranged on the package substrate 110 corresponding to an edge of the second electric/electronic device 130-2.

Referring to FIG. 7A, the resin film adhesive 154b may be arranged in a structure in which a portion thereof is exposed outside the second electric/electronic device 130-2, and the rest thereof is covered by the second electric/electronic device 130-2 when viewed from above. However, the arrangement structure of the resin film adhesive 154b is not limited thereto. For example, when viewed above, the resin film adhesive 154b may be mostly covered by the second electric/electronic device 130-2 and thus may not be exposed outside the second electric/electronic device 130-2.

In the semiconductor package module 100a or 100b according to the present embodiment, in the case where the device pad 135 is arranged in only an inner region of the second electric/electronic device 130-2 corresponding to a large-scale device, since the dummy pads 116d are provided onto portions of the package substrate 110 corresponding to edges of the second electric/electronic device 130-2, and the second electric/electronic device 130-2 is bonded onto the package substrate 110 through the composite adhesive 150c covering the dummy pads 116d and the solder bumps 150s, the second electric/electronic device 130-2, for example, a controller may be solidly bonded and fixed onto the package substrate 110 with high bonding strength. Also, based on the high bonding strength of the second electric/electronic device 130-2, the semiconductor package module 100a or 100b may be manufactured by using the BTA technology, and thus productivity may improve, and a replacement and/or operation loss of equipment may be reduced.

FIG. 8 is a plan view of a semiconductor package array structure 1000 according to example embodiments. For explaining concept, only primary parts are briefly illustrated.

Referring to FIG. 8, the semiconductor package array structure 1000 according to the present embodiment may include a plurality of semiconductor package modules 100 and a substrate support 110G. One of the semiconductor package modules 100 may correspond to the semiconductor package module 100 of FIG. 1A. However, it is not limited thereto and the semiconductor package array structure 1000 may include one of the semiconductor package modules 100a and 100b of FIGS. 7A and 7B.

In the semiconductor package array structure 1000 according to the present embodiment, the semiconductor package modules 100 may be arranged such that the top surface 110T and the bottom surface 110B of the package substrate 110 are alternately arranged in the second direction (y-direction). Also, first top electric/electronic devices 120T and the second electric/electronic device 130-2, which is a large-scale device, may be mounted onto the top surface 110T of the package substrate 110, and first bottom electric/electronic devices 120B may be mounted onto the bottom surface 110B of the package substrate 110. Though not shown, a structure of a bottom surface of the semiconductor package array structure 1000 according to the present embodiment may be substantially the same as the structure illustrated in FIG. 8.

Consequently, the package substrate array 110AR of the semiconductor package array structure 1000 according to the present embodiment may be manufactured by applying the BTA technology. Also, the semiconductor package array structure 1000 is separated into the semiconductor package modules 100, and so the semiconductor package modules 100, 100a, and 100b of FIGS. 1A, 7A, and 7B may be manufactured.

In the semiconductor package array structure 1000 according to the present embodiment, though one second electric/electronic device 130-2, for example, a controller is mounted onto each semiconductor package module 100, the number of second electric/electronic devices 130-2 mounted onto each semiconductor package module 100 is not limited to one. For example, in the semiconductor package array structure 1000 according to the present embodiment, at least two different second electric/electronic devices may be mounted onto each semiconductor package module 100. For example, as described above, the second electric/electronic device 130-2 may be mounted onto the package substrate 110 of the relevant semiconductor package module 100 through SMT and the resin film adhesive.

In the semiconductor package array structure 1000 according to the present embodiment, although eight semiconductor package modules 100 are arranged on the package substrate array 110AR, the number of semiconductor package modules 100 arranged on the package substrate array 110AR is not limited to eight. For example, as illustrated in FIG. 5B, four semiconductor package modules 100 may be arranged on the package substrate array 110AR. Also, besides four or eight, various even-numbered semiconductor package modules 100 may be arranged on the package substrate array 110AR.

While the inventive concept has been particularly shown and described with reference to exemplary embodiments thereof, it will be understood by those of ordinary skill in the art that various changes in form and details may be made therein without departing from the spirit and scope of the inventive concept as defined by the following claims.

What is claimed is:

1. A semiconductor package module comprising:
a module substrate;
at least one first electric/electronic device mounted on the module substrate by using surface mount technology (SMT);
a plurality of passive devices mounted on the module substrate; and
at least one second electric/electronic device mounted on the module substrate by using SMT and a resin film adhesive, the at least one second electric/electronic device having a size or a weight greater than a size or a weight of the at least one first electric/electronic device,
wherein the at least one second electric/electronic device includes a device pad arranged in an inner region of the at least one second electric/electronic device,
wherein the module substrate includes one or more dummy pads arranged along an edge of the at least one second electric/electronic device,
wherein the at least one second electric/electronic device is mounted onto the module substrate by using a solder paste on the one or more dummy pads and the resin film adhesive,
wherein the resin film adhesive covers the one or more dummy pads as a band shape along the edge of the at least one second electric/electronic device, and
wherein the at least one second electric/electronic device covers at least a portion of the resin film adhesive along the edge of the at least one second electric/electronic device.

2. The semiconductor package module of claim 1, wherein the at least one second electric/electronic device includes a device pad or a lead bonded onto a solder paste on a substrate pad of the module substrate, and
wherein the second electric/electronic device is bonded onto the module substrate at an outer portion of the solder paste by using the resin film adhesive.

3. The semiconductor package module of claim 2, wherein the semiconductor package module further includes a solder resist arranged around the substrate pad of the module substrate, and
wherein the resin film adhesive covers at least a portion of the solder paste and a portion of the solder resist.

4. The semiconductor package module of claim 2, wherein the solder paste has a shape of one of a polygon, a circle, and an ellipse from a plan view, and
wherein the resin film adhesive has an elongated shape in one direction, and covers at least a portion of the solder paste and a portion of a substrate body of the module substrate along an outer portion of the solder paste.

5. The semiconductor package module of claim 2, wherein the resin film adhesive is one of at least two resin film adhesives arranged per substrate pad of the module substrate.

6. The semiconductor package module of claim 1, wherein the module substrate comprises a double-layered printed circuit board (PCB) having wirings on two opposite surfaces thereof,
wherein the at least one first electric/electronic device and the plurality of passive devices are arranged on the two opposite surfaces of the module substrate, and
wherein the at least one second electric/electronic device is arranged on one of the two opposite surfaces or a lateral surface of the module substrate.

7. The semiconductor package module of claim 1, wherein the resin film adhesive comprises an epoxy film adhesive.

8. The semiconductor package module of claim 1, wherein the at least one second electric/electronic device comprises at least one of a connector, a controller, and an electrolytic cap.

9. A semiconductor package array structure comprising:
a module substrate array including at least two module substrates coupled to each other;
at least one first part mounted on each of the at least two module substrates by using surface mount technology (SMT);

at least one second part mounted on each of the at least two module substrates by using SMT and a resin film adhesive, the at least one second part having a size or a weight greater than a size or a weight of the at least one first part; and at least one passive device mounted on at least one of the module substrates, wherein a top surface and a bottom surface of the at least two module substrates are arranged alternately in a first direction when viewed from a first surface of the module substrate array, wherein the at least one second part comprises a device pad arranged in only an inner region of the at least one second part, wherein the at least two module substrates comprises a plurality of dummy pads arranged along an edge of the at least one second part, wherein the resin film adhesive covers the plurality of dummy pads as a hand shape along the edge of the at least one second part, and wherein the at least one second part covers at least a portion of the resin film adhesive along the edge of the at least one second part.

10. The semiconductor package array structure of claim 9, wherein the at least one second part is doubly bonded and mounted onto the at least two module substrates by using a solder paste on a substrate pad of the at least two module substrates, and the resin film adhesive on an outer portion of the solder paste.

11. The semiconductor package array structure of claim 10, wherein the semiconductor package array structure further comprises a solder resist arranged around the substrate pad of each of the at least two module substrates, wherein the solder paste has a horizontal cross-section of one of a polygon, a circle, and an ellipse, and wherein the resin film adhesive has an elongated shape in one direction, and covers at least a portion of the solder paste and a portion of the solder resist along an outer portion of the solder paste.

12. The semiconductor package array structure of claim 9, wherein each of the at least two module substrates comprises a double-layered printed circuit board (PCB) comprising wirings arranged on each of two opposite surfaces thereof, wherein the at least one first part is arranged on the two opposite surfaces of each of the at least two module substrates, wherein the at least one second part is arranged on one of the two opposite surfaces of each of the at least two module substrates, wherein, when viewed from the first surface, a top surface of the at least two module substrates on which the at least one second part is arranged, and a bottom surface of the at least two module substrates on which the at least one second part is not arranged are alternately arranged in the first direction, and wherein, when viewed from a second surface opposite to the first surface, the bottom surface of the at least two module substrates on which the at least one second part is not arranged, and the top surface of the at least two module substrates on which the at least one second part is arranged are alternately arranged in the first direction.

13. A semiconductor package module comprising:

a module substrate;

at least one first part mounted on the module substrate by using a solder paste; and at least one second part doubly bonded and mounted on the module substrate by using the solder paste and a resin film adhesive, the at least one second part having a size or a weight greater than a size or a weight of the at least one first part, wherein the module substrate includes a plurality of dummy pads arranged along an edge of the at least one second part, wherein the resin film adhesive covers the plurality of dummy pads, and wherein the at least one second part covers at least a portion of the resin film adhesive.

14. The semiconductor package module of claim 13, wherein the resin film adhesive has an elongated shape in one direction and covers at least a portion of the solder paste and a portion of a substrate body of the module substrate along an outer portion of the solder paste.

15. The semiconductor package module of claim 13, wherein the module substrate comprises a double-layered printed circuit board (PCB) comprising wirings arranged on each of two opposite surfaces thereof, and wherein the at least one first part comprises a chip package and a passive device and is arranged on the two opposite surfaces of the module substrate.

16. The semiconductor package module of claim 13, wherein the module substrate comprises a double-layered printed circuit board (PCB) comprising wirings arranged on each of two opposite surfaces thereof, and wherein the at least one second part comprises at least one of a connector, a controller, and an electrolytic cap, and is arranged on one of the two opposite surfaces or a lateral surface of the module substrate.

\* \* \* \* \*